United States Patent
Lin et al.

(10) Patent No.: US 9,384,985 B2
(45) Date of Patent: Jul. 5, 2016

(54) SEMICONDUCTOR STRUCTURE INCLUDING SILICON AND OXYGEN-CONTAINING METAL LAYER AND PROCESS THEREOF

(71) Applicant: UNITED MICROELECTRONICS CORP., Hsin-Chu (TW)

(72) Inventors: Chun-Hsien Lin, Tainan (TW); An-Chi Liu, Tainan (TW); Hsiao-Pang Chou, New Taipei (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/334,680

(22) Filed: Jul. 18, 2014

(65) Prior Publication Data

US 2016/0020104 A1      Jan. 21, 2016

(51) Int. Cl.
| | |
|---|---|
| *H01L 29/78* | (2006.01) |
| *H01L 21/28* | (2006.01) |
| *H01L 29/49* | (2006.01) |
| *H01L 29/66* | (2006.01) |
| *H01L 21/321* | (2006.01) |
| *H01L 21/8238* | (2006.01) |
| H01L 29/51 | (2006.01) |

(52) U.S. Cl.
CPC ...... *H01L 21/28088* (2013.01); *H01L 21/3212* (2013.01); *H01L 21/823842* (2013.01); *H01L 21/823857* (2013.01); *H01L 29/4966* (2013.01); *H01L 29/66545* (2013.01); *H01L 29/513* (2013.01); *H01L 29/517* (2013.01); *H01L 29/7843* (2013.01)

(58) Field of Classification Search
CPC ............ H01L 29/66734; H01L 29/7813; H01L 33/12; H01L 21/823835; H01L 29/41733; H01L 29/517; H01L 21/28079; H01L 21/31637
USPC .......................................... 257/369; 438/154
See application file for complete search history.

(56) References Cited

U.S. PATENT DOCUMENTS

| | | | | |
|---|---|---|---|---|
| 5,907,780 | A * | 5/1999 | Gilmer | H01L 29/518 257/E21.192 |
| 6,440,857 | B1 | 8/2002 | Li | |
| 7,247,256 | B2 | 7/2007 | Park | |
| 8,486,790 | B2 | 7/2013 | Huang | |
| 2005/0258030 | A1 * | 11/2005 | Finley et al. | 204/192.26 |
| 2008/0037027 | A1 * | 2/2008 | Harayama et al. | 356/468 |
| 2009/0140354 | A1 * | 6/2009 | Shin | 257/411 |
| 2010/0047993 | A1 * | 2/2010 | Pinto | H01L 21/26506 438/400 |
| 2010/0301429 | A1 | 12/2010 | Nabatame | |
| 2012/0319179 | A1 * | 12/2012 | Huang et al. | 257/288 |
| 2013/0153893 | A1 * | 6/2013 | Morosawa et al. | 257/43 |

* cited by examiner

*Primary Examiner* — Duy T Nguyen
(74) *Attorney, Agent, or Firm* — Winston Hsu; Scott Margo

(57) ABSTRACT

A metal gate process for polishing and oxidizing includes the following steps. A first dielectric layer having a trench is formed on a substrate. A barrier layer and a metal layer are formed sequentially to cover the trench and the first dielectric layer. A first chemical mechanical polishing process including a slurry of $H_2O_2$ with the concentration of 0~0.5 weight percent (wt. %) is performed to polish the metal layer until the barrier layer on the first dielectric layer is exposed. A second chemical mechanical polishing process including a slurry of $H_2O_2$ with the concentration higher than 1 weight percent (wt. %) is performed to polish the barrier layer as well as oxidize a surface of the metal layer remaining in the trench until the first dielectric layer is exposed, thereby a metal oxide layer being formed on the metal layer.

5 Claims, 5 Drawing Sheets

SEMICONDUCTOR STRUCTURE INCLUDING SILICON AND OXYGEN-CONTAINING METAL LAYER AND PROCESS THEREOF

BACKGROUND OF THE INVENTION

1. Field of the Invention

The present invention relates generally to a semiconductor structure and process thereof, and more specifically to a semiconductor structure and process thereof, which forms a silicon and oxygen—containing metal layer on a metal gate.

2. Description of the Prior Art

Poly-silicon is conventionally used as a gate electrode in semiconductor devices, such as the metal-oxide-semiconductor (MOS). With the trend towards scaling down the size of semiconductor devices, however, conventional poly-silicon gates face problems such as inferior performance due to boron penetration and unavoidable depletion effect. This increases equivalent thickness of the gate dielectric layer, reduces gate capacitance, and worsens a driving force of the devices. Therefore, work function metals that are suitable for use as the high-K gate dielectric layer are used to replace the conventional poly-silicon gate to be the control electrode. This control electrode of work function metals constitutes a metal gate.

In general, the method of replacing a conventional poly-silicon gate with a metal gate includes: removing the conventional poly-silicon gate and therefore forming a recess in an interdielectric layer; sequentially filling work function metals in the recess, that would cover the interdielectric layer as well. Thus, a planarization process would be performed to planarize the work function metals out of the recess and covering the interdielectric layer until the interdielectric layer is exposed, and the metal gate in the recess is formed. After the metal gate is formed, another dielectric layer will cover the interdielectric layer and the metal gate for forming interconnections above the metal gate and the interdielectric layer.

The above said planarization process may be a chemical mechanical polishing (CMP) process. In the semiconductor industry, chemical mechanical polishing (CMP) is the most common and important planarization tool applied. For example, the CMP process can be used to remove a topographical target of a thin film layer on a semiconductor wafer. The CMP process produces a wafer with both a regular and planar surface, to ensure a depth of focus (DOF) in the following photo process. In a CMP process, slurry is provided in a surface subject to planarization, and a mechanical polishing process is performed on the surface of the wafer. The slurry includes chemical agents and abrasives. The chemical agents maybe PH buffers, oxidants, surfactants or the like, and the abrasives may be silica, alumina, zirconium oxide, or the like. The chemical reactions evoked by the chemical agents and the abrasion between the wafer, the abrasives, and the polishing pad can planarize the surface of the wafer.

Moreover, after the metal gate is formed by the planarization process, another dielectric layer will cover the interdielectric layer and the metal gate. The interface between the interdielectric layer and the metal gate plays an important rule for performances.

SUMMARY OF THE INVENTION

The present invention provides a semiconductor structure and process thereof, which forms a silicon and oxygen-containing metal layer between a metal gate and a dielectric layer above for buffering.

The present invention provides a semiconductor process including the following steps. A first dielectric layer having a trench is formed on a substrate. A metal gate is formed in the trench. A silicon-containing deposition process is performed to import silicon atoms into a top surface of the metal gate, thereby forming a silicon-containing metal layer on the metal gate. A silicon and oxygen-containing deposition process is performed to form a second dielectric layer on the silicon-containing metal layer and the first dielectric layer.

The present invention provides a semiconductor structure including a first dielectric layer, a metal gate, a silicon and oxide-containing metal layer and a second dielectric layer. The first dielectric layer having a trench is disposed on a substrate. The metal gate is disposed on the trench. The silicon and oxide-containing metal layer covers the metal gate. The second dielectric layer covers the silicon and oxide-containing metal layer and the first dielectric layer.

According to the above, the present invention provides a semiconductor structure and a process thereof, which forms a silicon-containing metal layer between the metal gate and the second dielectric layer, to buffer the metal gate and the second dielectric layer. Therefore, microstructures between the metal gate and the second dielectric layer can be improved, defects such as dislocation between the metal gate and the second dielectric layer can be reduced, and electrical performance such as reliability can be enhanced.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
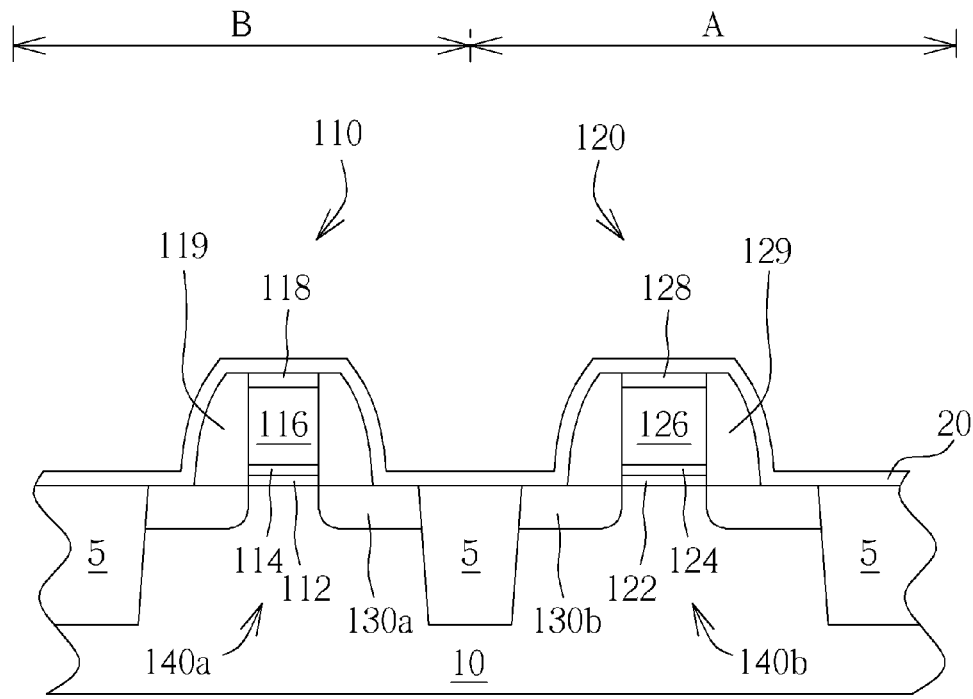
FIGS. 1-9 schematically depict cross-sectional views of a semiconductor process according to an embodiment of the present invention.

FIGS. 1-9 schematically depict cross-sectional views of a semiconductor process according to an embodiment of the present invention. As shown in FIG. 1, a substrate 10 is provided. The substrate 10 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. An isolation structure 5 is formed in the substrate 10 and thus the substrate 10 is divided into two active regions, such that the two active regions are a first area A and a second area B and the first area A is a PMOS transistor area while the second area B is a NMOS transistor area in this embodiment, but it is not limited thereto. The isolation structure 5 may be a shallow trench isolation (STI) structure, which may be formed by a shallow trench isolation process, but it is not limited thereto. The present invention is applied in a CMOS transistor having a PMOS transistor and a NMOS transistor in this embodiment, but the present invention, however, may be applied in single transistor such as an NMOS transistor or other devices, depending upon the needs.

Then, a first gate structure 110, a second gate structure 120 and two corresponding source/drain regions 130a and 130b are formed on the substrate 10. In this embodiment, the first gate structure 110 is for forming a NMOS transistor while the second gate 120 is for forming a PMOS transistor. In detail, the first gate structure 110 and the second gate structure 120 may respectively include buffer layers 112 and 122 located on the substrate 10, gate dielectric layers 114 and 124 located on the buffer layers 112 and 122, gate layers 116 and 126 located on the gate dielectric layers 114 and 124, cap layers 118 and 128 located on the gate layers 116 and 126 and spacers 119 and 129 located beside the buffer layers 112 and 122, the gate dielectric layers 114 and 124, the gate layers 116 and 126 and the cap layers 118 and 128.

The buffer layers 112 and 122 may be oxide layers, which may be formed through a chemical oxide process or a thermal oxide process, but it is not limited thereto. The buffer layers 112 and 122 are located between the gate dielectric layers 114 and 124 and the substrate 10 to buffer the gate dielectric layers 114 and 124 and the substrate 10. A gate-last for high-k first process is applied in this embodiment, so that the gate dielectric layers 114 and 124 are gate dielectric layers having a high dielectric constant, which may be the group selected from hafnium oxide (HfO2), hafnium silicon oxide (HfSiO4), hafnium silicon oxynitride (HfSiON), aluminum oxide (Al2O3), lanthanum oxide (La2O3), tantalum oxide (Ta2O5), yttrium oxide (Y2O3), zirconium oxide (ZrO2), strontium titanate oxide (SrTiO3), zirconium silicon oxide (ZrSiO4), hafnium zirconium oxide (HfZrO4), strontium bismuth tantalite (SrBi2Ta2O9, SBT), lead zirconate titanate (PbZrxTi1-xO3, PZT) and barium strontium titanate (BaxSr1-xTiO3, BST), but it is not limited thereto. In another embodiment, as a gate-last for high-k last process is applied, the gate dielectric layers 114 and 124 will be removed in later processes and then gate dielectric layers having a high dielectric constant is formed. Therefore, the material of the gate dielectric layers 114 and 124 may be just sacrificial materials suitable for being removed in later processes. The gate layers 116 and 126 may be made of polysilicon, but it is not limited thereto. The cap layers 118 and 128 may be respectively a single layer or a multilayer composed of a nitride layer or an oxide layer etc. used for being a patterned hard mask, but it is not limited thereto.

The spacers 119 and 129 may be respectively a single layer or a multilayer structure composed of materials such as silicon nitride or silicon oxide etc. Methods of forming the first gate structure 110 and the second gate structure 120 are well known in the art and are not described herein.

Then, a stress memorization technique (SMT) may be selectively performed to respectively force stress to the gate channels 140a and 140b beneath the first gate structure 110 and the second gate structure 120; thereby the carrier mobility of the gate channels 140a and 140b is improved. The stress memorization technique (SMT) may include forming a strained silicon material (not shown) in the source/drain regions 130a and 130b such as forming a silicon germanium layer in a PMOS transistor or forming a silicon carbide layer in an NMOS transistor, or covering a corresponding stress layer (not shown) on the first gate structure 110 and the second gate structure 120, but the techniques are not limited thereto. In this embodiment, a contact etch stop layer 20 blankety covers the first gate structure 110, the second gate structure 120 and the substrate 10 beside the first gate structure 110, the second gate structure 120, and the contact etch stop layer 20 is also a stress layer, which may be composed of doped silicon nitride or etc., for induced stress in the gate channels 140a and 140b beneath the first gate structure 110 and the second gate structure 120, but it is not limited thereto.

Figure 2:
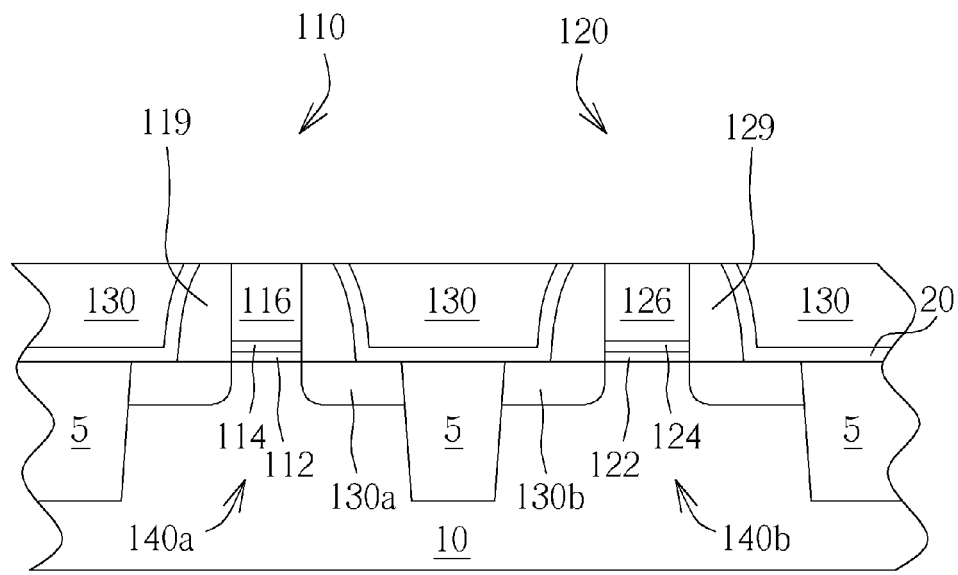

As shown in FIG. 2, a first dielectric layer 130 is formed on the substrate 10. The first dielectric layer may be an interdielectric layer, which may be composed of oxide, but it is not limited thereto. More precisely, a first dielectric layer (not shown) may entirely cover the first gate structure 110, the second gate structure 120 and the substrate 10 beside the first gate structure 110, the second gate structure 120; and then, the first dielectric layer is planarized by methods such as a chemical mechanical polishing (CMP) process until the cap layer 118 of the first gate structure 110 and the cap layer 128 of the second gate structure 120 (as shown in FIG. 1) are removed and the gate layer 116 of the first gate structure 110 and the gate layer 126 of the second gate structure 120 are exposed, but the methods are not restricted thereto.

Figure 3:
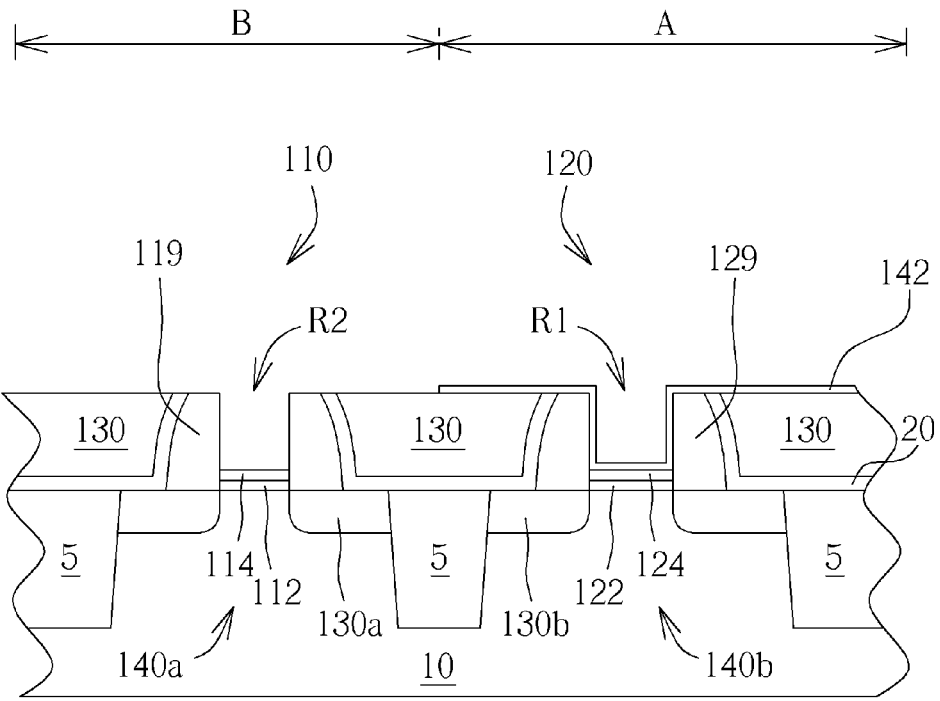

Thereafter, the gate layers 116 and 126 are removed by methods such as etching, and trenches R1 and R2 are respectively formed in the first dielectric layer 130, as shown in FIG. 3. Then, a first work function metal layer 142 may be formed only in the first area A and thus covers the trench R1 and the first dielectric layer 130 in the first area A. In detail, a first work function metal layer (not shown) may entirely cover the first dielectric layer 130 and the trenches R1 and R2 in the first area A and the second area B, and then be patterned by processes such as a photolithography process to remove the first work function metal layer (not shown) in the second area B but reserve the first work function metal layer 142 in the first area A. As the first work function metal layer 142 is used for forming a PMOS transistor, the first work function metal layer 142 should be composed of metals suited for forming the PMOS transistor such as titanium nitride/tantalum nitride or etc.

Figure 4:
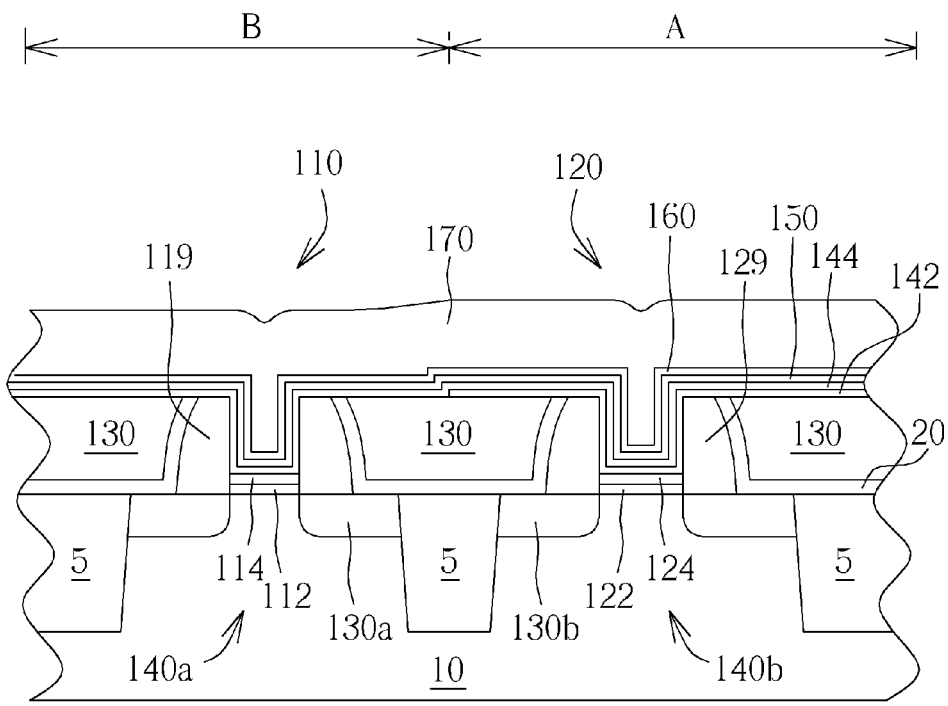

As shown in FIG. 4, a second work function metal layer 144 may cover the first work function metal layer 142 in the first area A, and the first dielectric layer 130 and the trench R2 in the second area B. The second work function metal layer 144 is suited for forming an NMOS transistor, so that it is composed of titanium aluminum in this embodiment, but it may be composed of other metals under other situations. Then, a barrier layer 150, a wetting layer 160 and a metal layer 170 may be sequentially formed to cover the second work function metal layer 144. The barrier layer 150 may be a single layer structure or a multilayer structure composed of tantalum nitride (TaN) or titanium nitride (TiN) etc. to prevent above disposed metals from diffusing downwards to the gate dielectric layers 114 and 124 and from polluting the gate dielectric layers 114 and 124. In this embodiment, the wetting layer 160 includes titanium, while the metal layer 170 includes aluminum, but it is not limited thereto.

Figure 5:
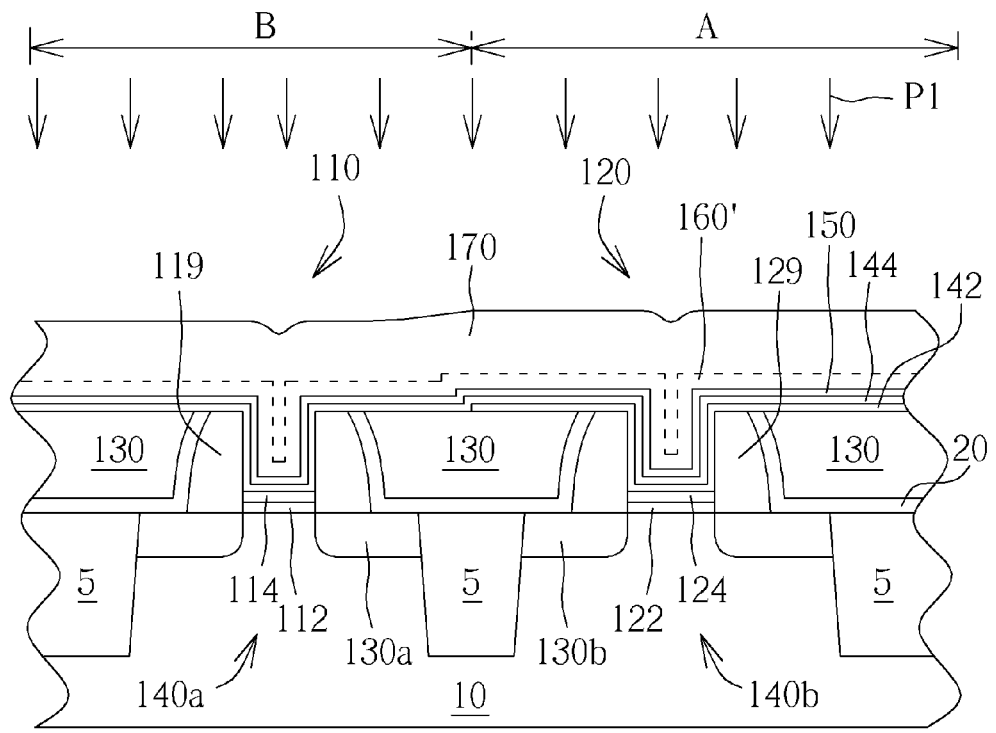

As shown in FIG. 5, an annealing process P1 may be performed, so that a wetting layer 160' may be formed by the diffusion of the wetting layer 160 and the metal layer 170, meaning the wetting layer 160 and a part of the metal layer 170 transforming into the wetting layer 160'. As the wetting layer 160 includes titanium and the metal layer 170 includes aluminum, the wetting layer 160' includes titanium aluminum. In detail, titanium concentration of the wetting layer 160' increases from top to bottom while aluminum concentration of the wetting layer 160' decreases from top to bottom. Preferably, the processing temperature of the annealing process P1 is about 400° C. for inter-diffusion between the wetting layer 160 and the metal layer 170, but it is not limited thereto.

Figure 6:
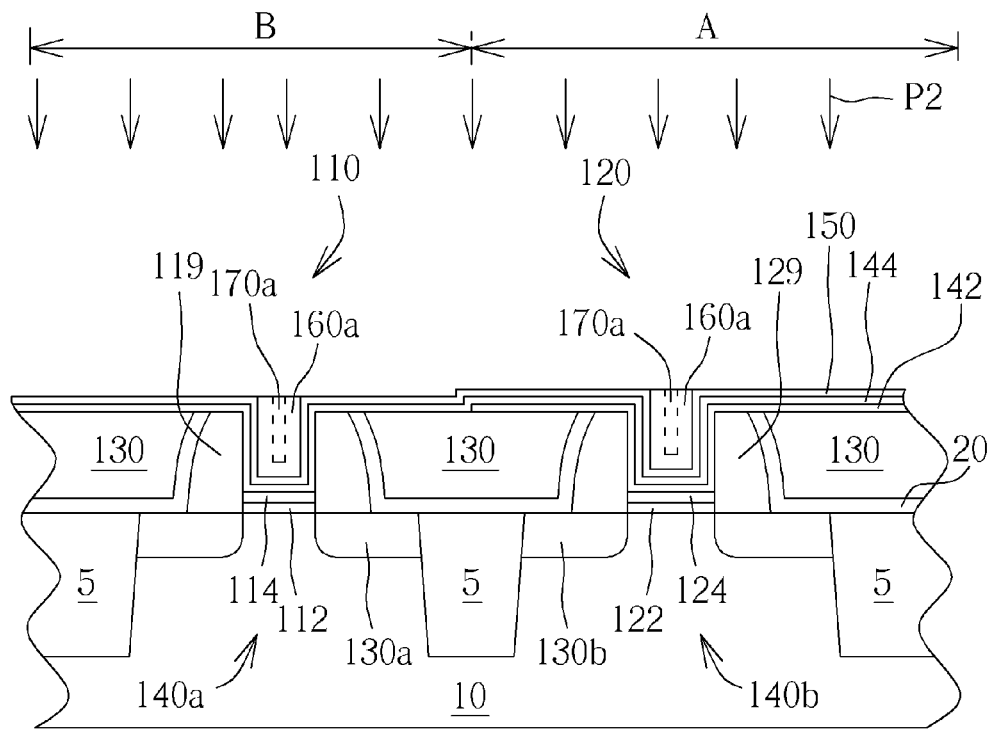
Figure 7:
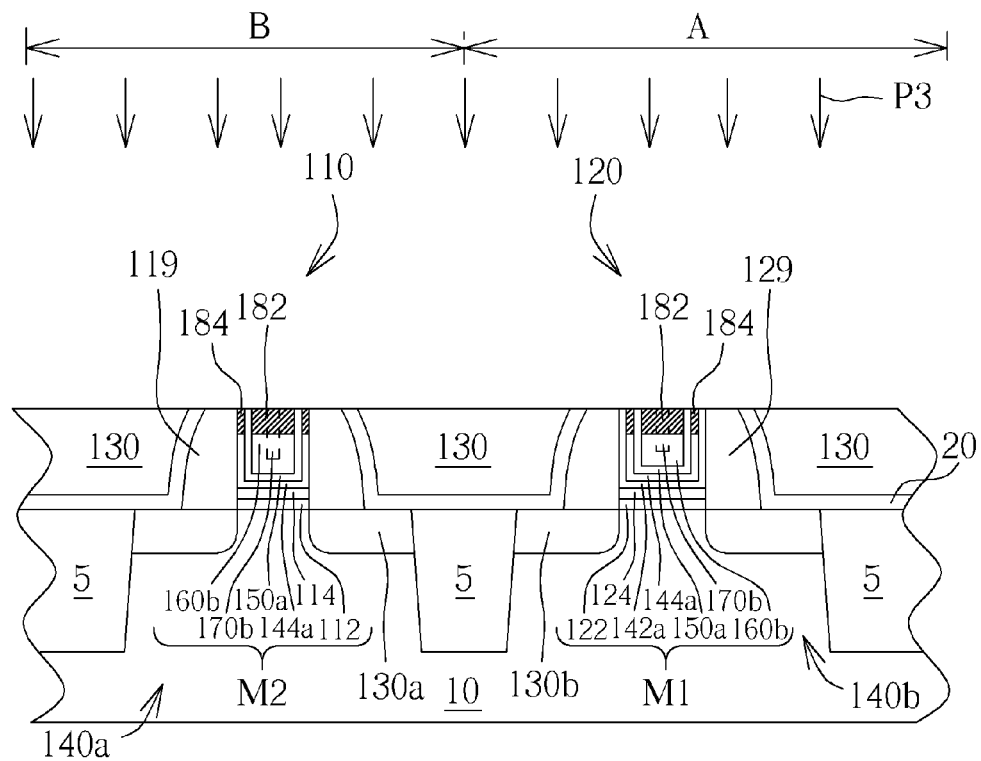

As shown in FIGS. 6-7, the metal layer 170, the wetting layer 160', the barrier layer 150, the second work function metal layer 144 and the first work function metal layer 142 may be polished, thereby metal gates M1 and M2 being formed respectively in the first area A and the second area B.

More precisely, a first chemical mechanical polishing process P2 may be performed to polish the metal layer 170 and the wetting layer 160' until the barrier layer 150 is exposed, and thus metal layers 170a and wetting layers 160a remain in the trenches R1 and R2, as shown in FIG. 6. The first chemical mechanical polishing process P2 preferably includes a slurry of hydrogen peroxide ($H_2O_2$) with the concentration of 0~0.5 weight percent (wt. %), thereby the first chemical mechanical polishing process P2 has a high polishing selectivity to the metal layer 170 and the wetting layer 160' and to the barrier layer 150. That is, the polishing rate of the first chemical mechanical polishing process P2 to the metal layer 170 and the wetting layer 160' is larger than to the barrier layer 150, thus the barrier layer 150 can serve as a polishing stop layer.

Then, a second chemical mechanical polishing process P3 may be performed to polish the metal layers 170a, the wetting layers 160a, the barrier layer 150, the second work function metal layer 144 and the first work function metal layer 142 until the first dielectric layer 130 is exposed, and thus metal layers 170b and wetting layers 160b, barrier layers 150a, second work function metal layers 144a and a first work function metal layer 142a remain in the trenches R1 and R2, thereby the metal gates M1 and M2 being formed, as shown in FIG. 7. The metal gates M1 and M2 both include the second work function metal layer 144a, the barrier layer 150a, the wetting layer 160b and the metal layer 170b. However, only the metal gate M1 includes the first work function metal layer 142a surrounding the second work function metal layer 144a.

It is emphasized that, the second chemical mechanical polishing process P3 preferably includes a slurry of hydrogen peroxide (H2O2) with the concentration higher than that of the first chemical mechanical polishing process P2. In this embodiment, the second chemical mechanical polishing process P3 preferably includes a slurry of hydrogen peroxide (H2O2) with the concentration higher than 1 weight percent (wt. %), thereby not only the metal layers 170a, the wetting layers 160a, the barrier layer 150, the second work function metal layer 144 and the first work function metal layer 142 can being polished by the second chemical mechanical polishing process P3, but also a top surface of remaining layers such as the metal layers 170b, the wetting layers 160b and the second work function metal layers 144a remaining in the trenches R1 and R2 will be oxidized. Moreover, the barrier layers 150a and the first work function metal layer 142a may also be oxidized, depending upon their materials.

Since the second chemical mechanical polishing process P3 includes a slurry of hydrogen peroxide (H2O2) with the concentration higher than 1 weight percent (wt. %), the second chemical mechanical polishing process P3 has a high polishing selectivity to the metal layers 170a, the wetting layers 160a, the barrier layer 150, the second work function metal layer 144 and the first work function metal layer 142 and to the first dielectric layer 130. That is, the polishing rate of the second chemical mechanical polishing process P3 to the metal layers 170a, the wetting layers 160a, the barrier layer 150, the second work function metal layer 144 and the first work function metal layer 142 is larger than to the first dielectric layer 130, thus first dielectric layer 130 can serve as a polishing stop layer. Meanwhile, metal oxide layers 182, 184 are formed on the top of the metal layers 170b, the wetting layers 160b and the second work function metal layers 144a because of the oxidization of the second chemical mechanical polishing process P3. As the metal layers 170b, the wetting layers 160b and the second work function metal layers 144a of the metal gates M1 and M2 include aluminum titanium (TiAl), the metal oxide layers 182, 184 includes aluminum titanium oxide (TiAlO) as well. By performing the second chemical mechanical polishing process P3, the formed metal oxide layers 182, 184 can prevent the below parts of the metal gates M1 and M2 from being damaged and oxidized. Furthermore, the metal oxide layers 182, 184 are thinner and denser than that formed by current processes in the industry such as performing an extra oxidizing process after a polishing process for forming metal gates. Besides, processing time and costs can be saved in the present invention due to only two chemical mechanical polishing processes being performed without extra oxidizing processes.

Preferably, for forming the thin and dense metal oxide layers 182, 184, the second chemical mechanical polishing process P3 includes a slurry of hydrogen peroxide ($H_2O_2$) with the concentration at a range of 1-2 weight percent (wt. %) for trading off polishing and oxidizing effect; the processing time of the second chemical mechanical polishing process P3 is longer than 50 seconds for fully oxidizing; and the processing down pressure of the second chemical mechanical polishing process is less than 1.5 psi (pounds per square inch) for fully oxidizing.

Figure 10:
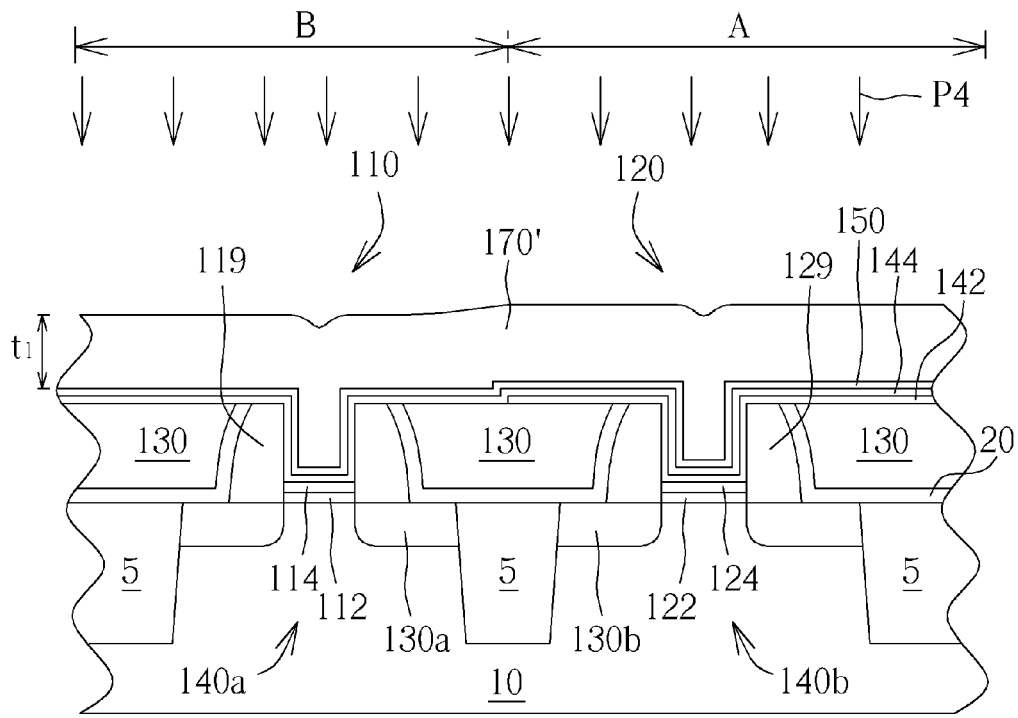
FIG. 10 schematically depicts a cross-sectional view of a semiconductor process according to an embodiment of the present invention.

According to the above, the metal layer 170, the wetting layer 160', the barrier layer 150, the second work function metal layer 144 and the first work function metal layer 142 may be polished by sequentially performing the first chemical mechanical polishing process P2 and the second chemical mechanical polishing process P3, so that the thin and dense metal oxide layers 182, 184 can be formed at the same time. In a still improved embodiment, before the first chemical mechanical polishing process P2 is performed, a third chemical mechanical polishing process P4 may be performed to thin the metal layer 170 of FIG. 5 firstly to form a metal layer 170', as shown in FIG. 10. The polishing rate of the third chemical mechanical polishing process P4 to the metal layer 170 is preferably higher than the polishing rate of the first chemical mechanical polishing process P2 to the metal layer 170'. Thus, the metal layer 170 can be thinned down efficiently by the third chemical mechanical polishing process P4 through adjusting the polishing rate of the third chemical mechanical polishing process P4, and then the metal layer 170' can be polished by the first chemical mechanical polishing process P2 for precisely controlling the polishing stopping on the barrier layer 150 without over-etching, and for reducing the affection of the loading effect. The thickness t1 of the metal layer 170' remaining after the third chemical mechanical polishing process P4 is preferably larger than 100 angstroms to maintain enough thickness for the polishing of the first chemical mechanical polishing process P2; the down pressure of the third chemical mechanical polishing process P4 is higher than the down pressure of the first chemical mechanical polishing process P2, to save processing time, reducing the loading effect and stopping the polishing precisely.

Figure 8:
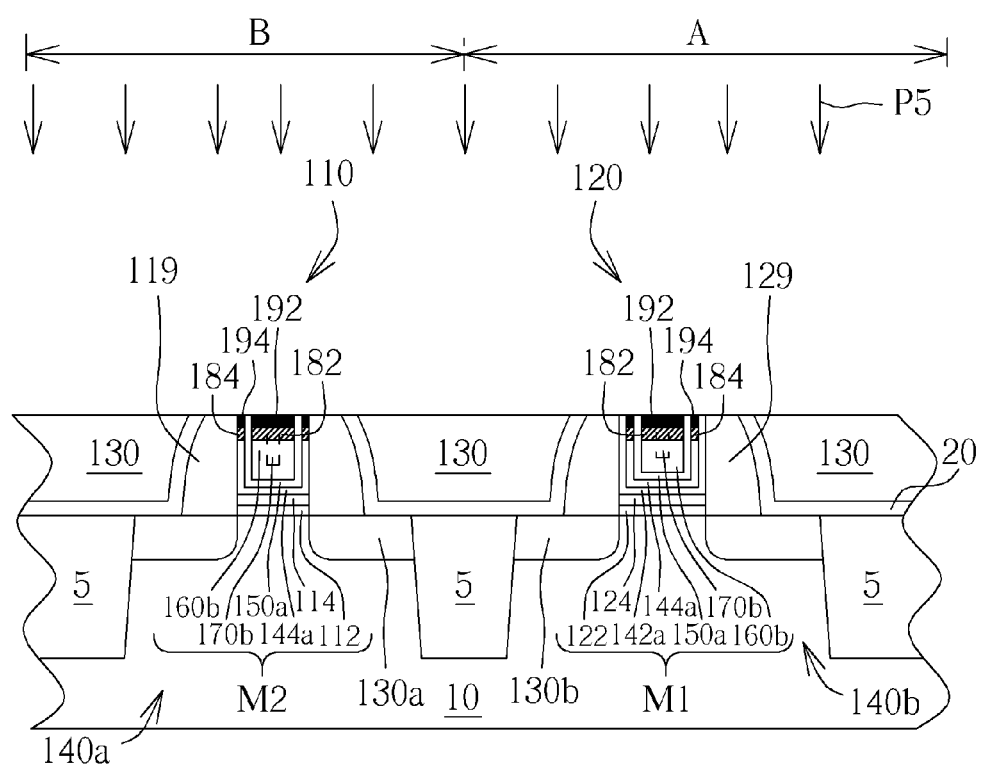
Figure 9:
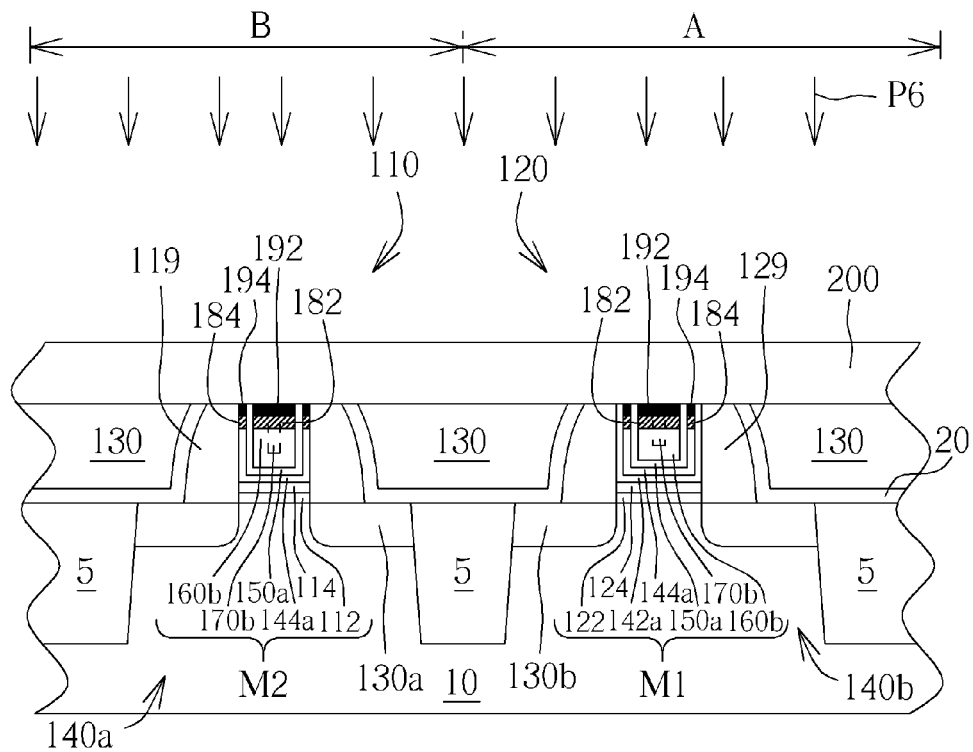

As shown in FIG. 8, a silicon-containing deposition process P5 is performed to import silicon atoms into a top surface S of the metal gates M1 and M2, thereby silicon-containing metal layers 192 and 194 being formed on the metal gates M1 and M2. More precisely, the silicon-containing metal layers 192 and 194 are formed by transforming the top of the metal oxide layers 182, 184. Thereafter, as shown in FIG. 9, a silicon and oxygen-containing deposition process P6 is performed to form a second dielectric layer 200 blanketly on the silicon-containing metal layers 192 and 194 and the first dielectric layer 130. The second dielectric layer 200 maybe silicon oxide layer or etc. By forming the silicon-containing metal layers 192 and 194 between the metal gates M1 and M2 and the second dielectric layer 200, the metal gates M1 and M2 and the second dielectric layer 200 can be buffered by the silicon-containing metal layers 192 and 194 due to the gradient changes of ingredients from the top of the metal gates M1 and M2 to the bottom of the second dielectric layer 200.

Thereby, microstructures between the metal gates M1 and M2 and the second dielectric layer 200 can be improved, defects such as atom vacancies and voids between the metal gates M1 and M2 and the second dielectric layer 200 can be reduced, and electrical performance such as reliability can be enhanced.

In this embodiment, as the metal oxide layers 182, 184 of the metal gates M1 and M2 include titanium aluminum oxide (TiAlO), and the silicon-containing metal layers 192 and 194 include titanium aluminum silicon oxide (TiAlOSi). That is, the silicon-containing metal layers 192 and 194 in this embodiment include silicon and oxygen atoms, thus the interface of the metal gates M1 and M2 and the second dielectric layer 150 including silicon oxide can be improved and buffered due to the silicon-containing metal layers 192 and 194 and the second dielectric layer 150 including same atoms. More precisely, the silicon-containing metal layers 192 and 194 has silicon concentration decreasing from a top surface to a bottom surface. The silicon-containing metal layers 192 and 194 and the metal oxide layers 182, 184 have oxygen concentration decreasing from a top surface of the silicon and oxide-containing metal layer to a bottom surface of the metal oxide layer.

Preferably, the silicon-containing deposition process P5 and the silicon and oxygen-containing deposition process P6 are performed in-situ for saving processing time and costs, and preventing formed devices from being polluted or oxidized. In one case, the silicon-containing deposition process P5 and the silicon and oxygen-containing deposition process P6 may both be performed by plasma-enhanced chemical vapor deposition (PECVD) processes, but it is not limited thereto. More precisely, the plasma-enhanced chemical vapor deposition (PECVD) processes may have reactive gases such as silane ($SiH_4$), tetraethoxysilane nitrous oxide (TEOS $N_2O$) and oxygen ($O_2$) gases imported. Preferably, the silicon-containing deposition process P5 maybe a plasma-enhanced chemical vapor deposition (PECVD) process having silane ($SiH_4$) gas imported while the silicon and oxygen-containing deposition process P6 may be a plasma-enhanced chemical vapor deposition (PECVD) process having silane ($SiH_4$), tetraethoxysilane nitrous oxide (TEOS $N_2O$) (and oxygen ($O_2$)) gases imported. That is, the silicon-containing deposition process P5 and the silicon and oxygen-containing deposition process P6 may be performed by plasma-enhanced chemical vapor deposition (PECVD) processes having silane ($SiH_4$) gas imported first before nitrous oxide (TEOS $N_2O$) (and oxygen ($O_2$) gases) gas being imported, and then nitrous oxide (TEOS $N_2O$) gas (and oxygen ($O_2$) gases) imported. The silicon -containing deposition process P5 may have silane gas imported, while the silicon and oxygen-containing deposition process P6 may have silane($SiH_4$) gas and nitrous oxide ($N_2O$) gases imported. Thus, the silicon-containing deposition process P5 and the silicon and the oxygen-containing deposition process P6 can be performed in-situ through performing the silicon-containing deposition process P5 having silane gas imported and then performing the oxygen-containing deposition process P6 by having nitrous oxide ($N_2O$) gases further imported with silane gas imported still, but it is not limited thereto.

To summarize, the present invention provides a semiconductor structure and a process thereof, which forms a silicon-containing metal layer between the metal gate and the second dielectric layer, to buffer the metal gate and the second dielectric layer. Therefore, microstructures between the metal gate and the second dielectric layer can be improved, defects such as dislocation between the metal gate and the second dielectric layer can be reduced, and electrical performance such as reliability can be enhanced.

Preferably, the silicon-containing metal layer and the second dielectric layer may be formed in-situ. As the silicon-containing metal layer is formed by the silicon-containing deposition process and the second dielectric layer is formed by the silicon and oxygen-containing deposition process, the silicon-containing deposition process can be performed by having silane gas imported and the silicon and oxygen-containing deposition process can be performed by having nitrous oxide gas further imported with silane gas imported still. The silicon-containing deposition process and the silicon and oxygen-containing deposition process may both be silicon and oxygen-containing deposition processes.

Furthermore, the metal gate may have the thin and dense metal oxide layer on the top through sequentially performing chemical mechanical polishing (CMP) processes capable of polishing and oxidizing simultaneously without performing extra oxidizing processes. In one case, as the metal gate includes titanium aluminum (TiAl), the metal oxide layer includes titanium aluminum oxide (TiAlO), therefore the silicon-containing metal layer includes titanium aluminum silicon oxide (TiAlOSi).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a first dielectric layer having a trench disposed on a substrate;
   a metal gate disposed on the trench;
   a silicon and oxide-containing metal layer covering a top surface of the metal gate, wherein the silicon and oxide-containing metal layer has silicon concentration decreasing from a top surface to a bottom surface, the metal gate comprises a metal oxide layer and the silicon and oxide-containing metal layer directly covers the metal oxide layer; and
   a second dielectric layer covering the silicon and oxide-containing metal layer and the first dielectric layer.

2. The semiconductor structure according to claim 1, wherein the metal gate comprises titanium aluminum and the metal oxide layer comprises titanium aluminum oxide (TiAlO).

3. The semiconductor structure according to claim 2, wherein the silicon and oxide-containing metal layer comprises titanium aluminum silicon oxide (TiAlOSi).

4. The semiconductor structure according to claim 1, wherein the second dielectric layer comprises a silicon oxide layer.

5. The semiconductor structure according to claim 1, wherein the silicon and oxide-containing metal layer and the metal oxide layer have oxygen concentration decreasing from the top surface of the silicon and oxide-containing metal layer to a bottom surface of the metal oxide layer.

* * * * *